(12) United States Patent
Katagiri et al.

(10) Patent No.: US 8,633,596 B2
(45) Date of Patent: Jan. 21, 2014

(54) SEMICONDUCTOR PACKAGE WITH BONDING WIRES OF REDUCED LOOP INDUCTANCE

(76) Inventors: Mitsuaki Katagiri, Tokyo (JP); Ken Iwakura, Tokyo (JP); Yutaka Uematsu, Kanagawa (JP)

(*) Notice: Subject to any disclaimer, the term of this patent is extended or adjusted under 35 U.S.C. 154(b) by 253 days.

(21) Appl. No.: 13/291,740

(22) Filed: Nov. 8, 2011

(65) Prior Publication Data

US 2012/0119387 A1    May 17, 2012

(30) Foreign Application Priority Data

Nov. 11, 2010  (JP) ................................. 2010-252913

(51) Int. Cl.
*H01L 23/48* (2006.01)
*H01L 23/52* (2006.01)
*H01L 29/40* (2006.01)

(52) U.S. Cl.
USPC .................... 257/777; 257/786; 257/E23.079

(58) Field of Classification Search
USPC ................ 257/777, 778, 784, 786, 787, 686, 257/E23.079, E23.142; 438/108, 109
See application file for complete search history.

(56) References Cited

U.S. PATENT DOCUMENTS

| 7,777,350 B2 | 8/2010 | Sasaki et al. | |
|---|---|---|---|
| 8,288,852 B2 * | 10/2012 | Uematsu et al. | 257/686 |
| 2005/0084989 A1 | 4/2005 | Wakabayashi et al. | |
| 2006/0192292 A1 * | 8/2006 | Wang et al. | 257/777 |

FOREIGN PATENT DOCUMENTS

| JP | 2005-123291 A | 5/2005 |
|---|---|---|
| JP | 2009-38142 A | 2/2009 |

* cited by examiner

*Primary Examiner* — Chuong A Luu
*Assistant Examiner* — Nga Doan
(74) *Attorney, Agent, or Firm* — Foley & Lardner LLP

(57) ABSTRACT

A semiconductor package includes a semiconductor device including a plurality of signal pads and a plurality of auxiliary pads which are alternatively arranged in a predetermined direction, and a package board including a plurality of signal bond fingers, a plurality of first power supply voltage bond fingers, and a plurality of second power supply voltage bond fingers. The signal pads are connected respectively to the signal bond fingers by first wires. The first power supply voltage bond fingers and the second power supply voltage bond fingers are connected respectively to the auxiliary pads by second wires. The first wires are disposed between those of the second wires which are connected to the first power supply voltage bond fingers and those of the second wires which are connected to the second power supply voltage bond fingers.

12 Claims, 9 Drawing Sheets

US 8,633,596 B2

SEMICONDUCTOR PACKAGE WITH BONDING WIRES OF REDUCED LOOP INDUCTANCE

This application is based upon and claims the benefit of priority from Japanese Patent Application No. 2010-252913 filed on Nov. 11, 2010, the content of which is incorporated by reference.

BACKGROUND OF THE INVENTION

1. Field of the Invention

The present invention relates to a semiconductor package including a semiconductor device mounted on a package board.

2. Description of the Related Art

The structure of a semiconductor package including a semiconductor device will be described below. First, the structure of the semiconductor device will be described below. FIG. 1 of the accompanying drawings is a block diagram showing a structural example of semiconductor device 10 according to the related art. It is assumed that semiconductor device 10 is a DRAM (Dynamic Random Access Memory).

As shown in FIG. 1, semiconductor device 10 includes a plurality of memory cell blocks 20-1 through 20-n (n represents an integer which is 1 or greater) each including a plurality of memory elements, CA pad array 31 including a plurality of terminals to which address signals and command signals are input from an external source, DQ pad array 32 including a plurality of terminals which send data to and receive data from an external source, column decoder 41 and row decoder 42 for specifying a memory element according to an address signal, and data input/output control circuit 45 for controlling the inputting and outputting of data.

An address signal is a signal for specifying either one of the memory elements. A command signal is a signal for indicating the writing of data into or the reading of data from the memory elements.

CA pad array 31 includes command signal pads to which command signals are input from the external source and address signal pads to which address signals are input from the external source. The address signal pads and the command signal pads will be hereinafter collectively referred to as signal pads.

DQ pad array 32 includes a plurality of data pads which send and receive data. Each of CA pad array 31 and DQ pad array 32 includes a power supply voltage pad to which a power supply voltage (Vdd) is applied from an external source and a ground potential pad to which a ground potential (Vss or Gnd) is applied from an external source. The power supply voltage pad will be hereinafter referred to as a Vdd pad, and the ground potential pad as a Vss pad.

In FIG. 1, a receiver circuit for amplifying signals input from an external source and an input/output circuit for amplifying data which are sent to and received from an external source are omitted from illustration.

FIG. 2 of the accompanying drawings is a cross-sectional view showing a structural example of a semiconductor package including the semiconductor device shown in FIG. 1.

As shown in FIG. 2, semiconductor device 10 is mounted on package board 50 and covered with resin body 56. Pads 200 disposed on the upper surface of semiconductor device 10 are connected to bond fingers 210 on package board 50 by bonding wires (hereinafter simply referred to as "wires") 220. Pads 200 are one type of the pads included in CA pad array 31 or DQ pad array 32. Bond fingers 210 are one type of electrically conductive pads which are electrically connected to pads 200 on semiconductor device 10 by wires 220, and are connected to solder balls 51 by interconnects 52 and via plugs 54.

Of interconnects 52 disposed on package board 50, the interconnects connected to the command signal pads of CA pad array 31 are referred to as command interconnects, the interconnects connected to the address signal pads of CA pad array 31 as address interconnects, and the interconnects connected to the data pads of DQ pad array 32 as data interconnects.

An example of stacked semiconductor package which is of a PoP (Package on Package) structure with a plurality of semiconductor devices mounted on a printed wiring board is disclosed in JP 2009-38142A. An example of technology relative to a redistribution layer (RDL) referred to in JP 2009-38142A is disclosed in JP 2005-123291A.

FIG. 3 of the accompanying drawings is a plan view showing connections between pads on a semiconductor device and bond fingers on a package board. FIG. 3 shows a portion of CA pad array 31.

As shown in FIG. 3, bond fingers 211 through 216 are disposed on package board 50 in a vertical array as shown. Vdd pad 201, address signal pads 202 through 205, and Vss pad 206 are disposed on semiconductor device 10 parallel to the pad array of bond fingers 211 through 216.

"V" noted on Vdd pad 201 and bond finger 211 indicates that they are the pad and the bond finger to which Vdd is applied. "G" noted on Vss pad 206 and bond finger 216 indicates that they are the pad and the bond finger to which Vss is applied. "A1" through "A4" noted on address signal pads 202 through 205 and bond fingers 211 through 215 indicate that they are the pads and the bond fingers to which address signals A1 through A4 are transmitted.

Each of address signal pads 202 through 205 is connected through interconnects to amplifiers in the receiver circuit.

In FIG. 3, only address signal pads for address signals A1 through A4 are illustrated, and address signal pads for address signals other than address signals A1 through A4 and command signal pads are omitted from illustration. For example, address signal pads (not shown) for address signals other than address signals A1 through A4 and command signal pads (not shown) are disposed below Vss pad 206 shown in FIG. 3.

Vdd pad 201, address signal pads 202 through 205, and Vss pad 206 are arranged in a single array at a spaced interval between adjacent ones thereof. Bond fingers 211 through 216 are disposed at respective vertical positions aligned with Vdd pad 201, address signal pads 202 through 205, and Vss pad 206, respectively. Vdd pad 201 and bond finger 211 are connected to each other by wire 221. Vss pad 206 and bond finger 216 are connected to each other by wire 226. Address signal pads 202 through 205 are connected to respective bond fingers 212 through 215 by respective wires 222 through 225.

In one array of pads, the ratio of the number of successive signal pads to a Vss pad or a Vdd pad is defined as "SG ratio" which means the ratio between signals and ground (or power supply). In the structural example shown in FIG. 3, since there is one Vdd pad or Vss pad for four address signal pads, the SG ratio is 4:1. The SG ratio of the numbers of bond fingers which connect these pads to the bond fingers is also 4:1. The SG ratio is similarly defined for address signal pads and wires which are not illustrated.

According to the PoP structure, the command interconnects and the address interconnects often extend longer parallel to the principal surface of package board 50 than the data interconnects due to the interconnect density and interconnect limitations. Furthermore, since each of wires 221 through 226 shown in FIG. 3 has a parasitic inductance as shown in FIG. 4 of the accompanying drawings, and the SG ratio of the CA pad array is 4:1 as described above with reference to FIG. 3, which is smaller than the SG ratio of the DQ pad array, the wires have a low power feeding capability and each develop a parasitic inductance between itself and an adjacent wire. As the bop inductance between S (signal) and G (ground) wires is large, the wires are subject to large noise and jitter.

According to the LPDDR2 (Low Power Double Data Rate 2) standards, since address interconnects transfer signals at a double rate, it is important to reduce such noise and jitter for better signal quality.

SUMMARY

In one embodiment, there is provided a semiconductor package that includes a semiconductor device including a plurality of signal pads and a plurality of auxiliary pads which are alternatively arranged in a predetermined direction, and a package board including a plurality of signal bond fingers arranged in the predetermined direction for supplying signals to the signal pads, a plurality of first power supply voltage bond fingers arranged in the predetermined direction for supplying a first power supply voltage to the auxiliary pads, and a plurality of second power supply voltage bond fingers arranged in the predetermined direction for supplying a second power supply voltage to the auxiliary pads, the semiconductor device being mounted on the package board. The signal pads are connected respectively to the signal bond fingers by first wires. The first power supply voltage bond fingers and the second power supply voltage bond fingers are connected respectively to the auxiliary pads by second wires. The first wires are disposed between those of the second wires which are connected to the first power supply voltage bond fingers and those of the second wires which are connected to the second power supply voltage bond fingers.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

Semiconductor packages according to exemplary embodiments of the present invention will be described below. In each of the exemplary embodiments to be described below, it is assumed that a semiconductor device incorporated in the semiconductor package is a DRAM.

1st Exemplary Embodiment

Figure 5:
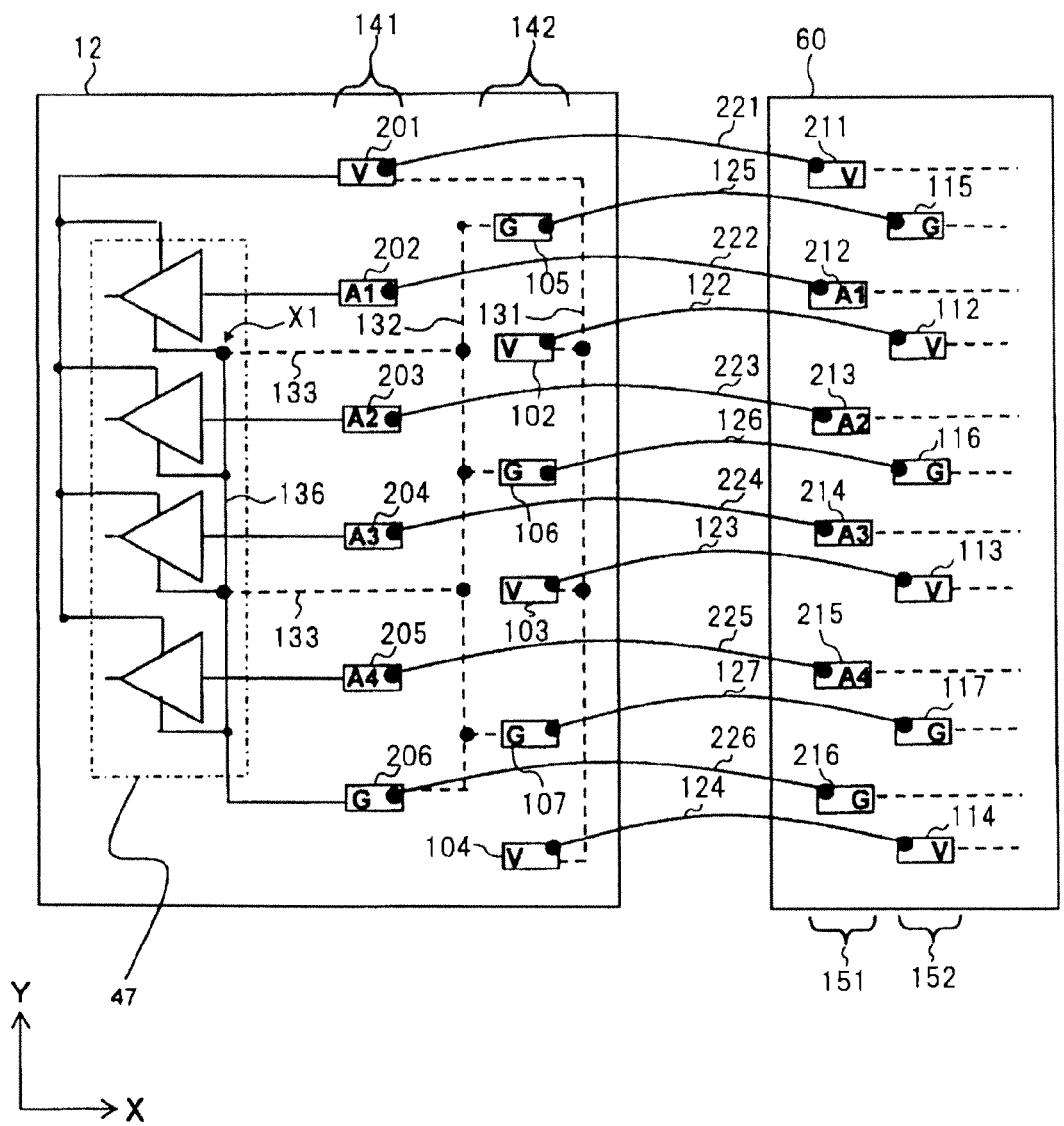
FIG. 5 is a plan view illustrative of a structural example of a central portion of a semiconductor package according to a first exemplary embodiment of the present invention.

The structure of a semiconductor package according to the first exemplary embodiment will be described below. FIG. 5 is a plan view illustrative of a structural example of a central portion of the semiconductor package according to the first exemplary embodiment.

Figure 3:
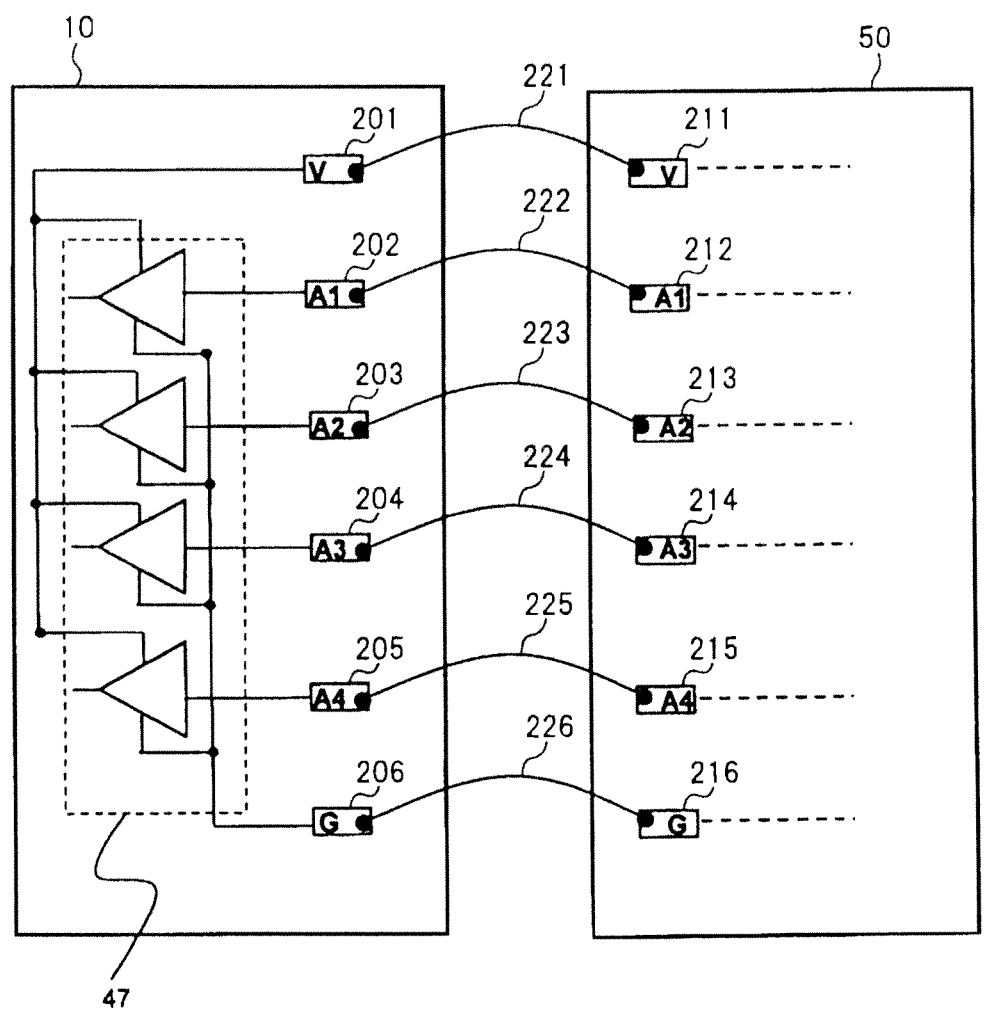
FIG. 3 is a plan view showing connections between pads on a semiconductor device and bond fingers on a package board in the semiconductor package shown in FIG. 2.
Figure 4:
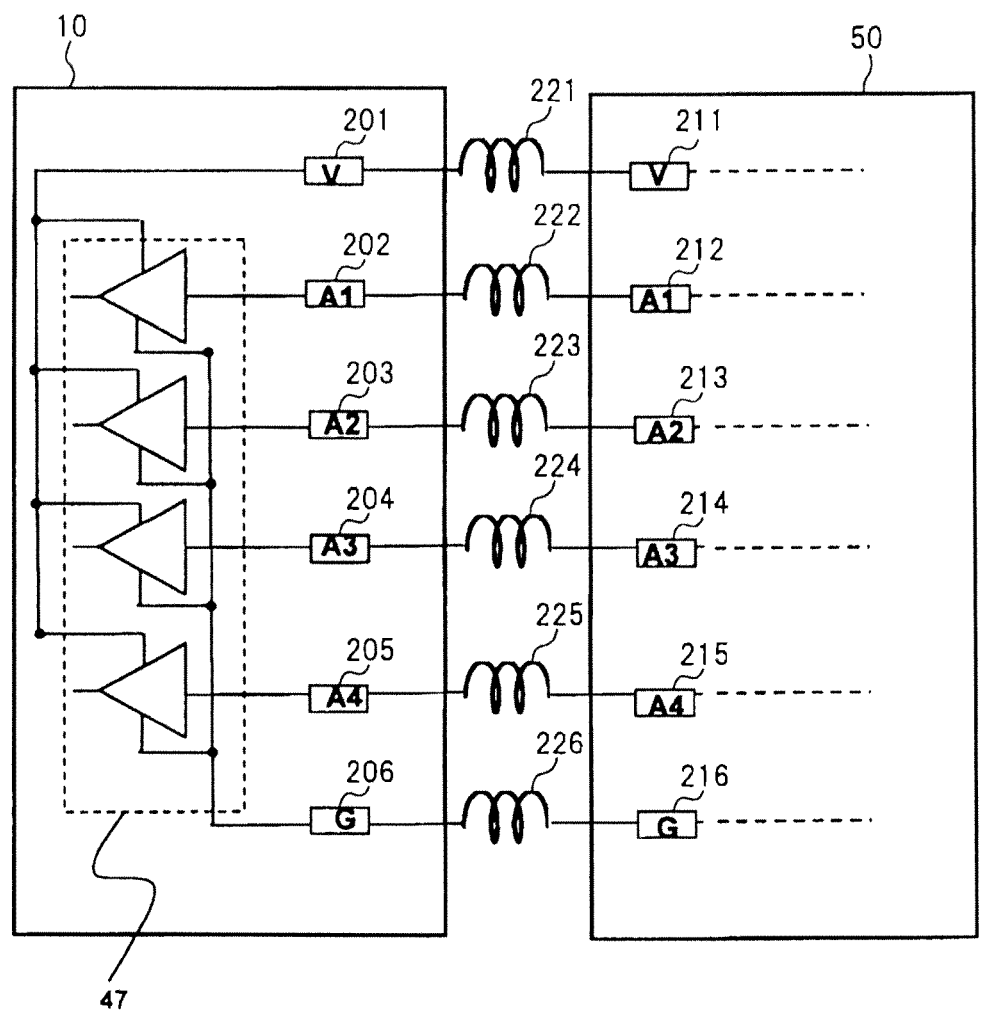
FIG. 4 is a plan view showing the wires in FIG. 3 as respective parasitic inductances.

FIG. 5 shows connections between pads on semiconductor device 12 and bond fingers on package board 60. It is assumed that horizontal directions in FIG. 5 are referred to as X-axis directions and vertical directions as Y-axis directions. Semiconductor device 12 has the structure shown in FIG. 1. The structural details shown in FIG. 1 will not be described below, and those details of semiconductor device 12 which are different from those shown in FIG. 3 will be described below.

Semiconductor device 12 is mounted on package board 60. In FIG. 5, a portion of package board 60 is shown separately to clearly illustrate connections between pads on semiconductor device 12 and bond fingers on package board 60. A planar portion of semiconductor device 12 in the vicinity of the pads thereon is also shown separately in FIG. 5.

As shown in FIG. 5, semiconductor device 12 includes, in addition to Vdd pad 201, address signal pads 202 through 205, and Vdd pad 206, Vdd pads 102 through 104 and Vss pads 105 through 107 as auxiliary pads. Vdd pad 201, address signal pads 202 through 205, and Vdd pad 206 are arrayed in pad array 141, and Vdd pads 102 through 104 and Vss pads 105 through 107 as pad array 142.

Vdd pads 102 through 104 serve as auxiliary pads for a power supply voltage, and Vss pads 105 through 107 as auxiliary pads for a ground potential.

Pad array 141 and pad array 142 extend parallel to the Y-axis directions, and are disposed in different directions along the X-axis directions. Pad array 142 is positioned more closely to an outer peripheral edge of semiconductor device 12 than pad array 141. In pad array 141, Vdd pad 201, address signal pads 202 through 205, and Vdd pad 206 are successively arranged at a spaced interval between adjacent ones thereof along the Y-axis directions. In pad array 142, the Vdd pads and the Vss pads are alternately arranged at a spaced interval between adjacent ones thereof along the Y-axis directions.

Vdd pads 102 through 104 and Vss pads 105 through 107 of pad array 142 are fabricated according the RDL technology. Furthermore, interconnects which connect Vdd pads 102 through 104 to Vdd pad 201 and interconnects which connect Vss pads 105 through 107 to Vss interconnect 136 of receiver circuit 47 are also fabricated according the RDL technology. Interconnects fabricated according the RDL technology will hereinafter be referred to as RDL interconnects. In FIG. 5, the RDL interconnects are indicated by broken lines.

Vdd pads 102 through 104 are connected to Vdd pad 201 by RDL interconnect 131. Vss pads 105 through 107 are connected to each other by RDL interconnect 132. RDL interconnect 132 is connected to Vss interconnect 136 of receiver circuit 47 by RDL interconnects 133. Since the auxiliary pads for the power supply voltage are connected to each other by RDL interconnect 131, the voltage levels of the wires connected respectively to the auxiliary pads for the power supply voltage can be held more stably. This also holds true for the wires connected respectively to the auxiliary pads for the ground potential.

Package board 60 includes bond fingers 112 through 117 in addition to bond fingers 211 through 216. Bond fingers 211 through 216 and bond fingers 112 through 117 are fabricated as printed interconnects. Bond fingers 211 through 216 are arrayed in bond finger array 151, and bond fingers 112 through 117 as bond finger array 152. In bond finger array 151, bond fingers 211 through 216 are successively arranged at a spaced interval between adjacent ones thereof along the Y-axis directions. In bond finger array 152, bond fingers 115, 112, 116, 113, 117, 114 are alternately arranged at a spaced interval between adjacent ones thereof along the Y-axis directions.

"V", "G", and "A1" through "A4" noted on the pads and the bond fingers shown in FIG. 5 have the same meanings as those described above with reference to FIG. 3, and will not be described below. Bond fingers 211, 112 through 114 serve as power supply voltage bond fingers for supplying a power supply voltage to semiconductor device 12, and bond fingers 216, 115 through 117 as ground potential bond fingers for supplying a ground potential to semiconductor device 12. Bond fingers 212 through 215 serve as signal bond fingers for supplying address signals to semiconductor device 12. In FIG. 5, address signal pads for address signals other than address signals A1 through A4 and command signal pads are also omitted from illustration.

The positions in the Y-axis directions of the auxiliary pads of pad array 142 on semiconductor device 12 will be compared with the positions of the pads of pad array 141 below. Vss pad 105 is disposed between Vdd pad 201 and address signal pad 202. Vdd pad 102 is disposed between address signal pad 202 and address signal pad 203. Vss pad 106 is disposed between address signal pad 203 and address signal pad 204. Vdd pad 103 is disposed between address signal pad 204 and address signal pad 205. Vss pad 107 is disposed between address signal pad 205 and Vss pad 206. Vdd pad 104 is disposed below Vss pad 206 in FIG. 5.

The positions in the Y-axis directions of the bond fingers of bond finger array 152 on package board 60 will be compared with the positions of the bond fingers of bond finger array 151 below. Bond finger 115 is disposed between bond finger 211 and bond finger 212. Bond finger 112 is disposed between bond finger 212 and bond finger 213. Bond finger 116 is disposed between bond finger 213 and bond finger 214. Bond finger 113 is disposed between bond finger 214 and bond finger 215. Bond finger 117 is disposed between bond finger 215 and bond finger 216. Bond finger 114 is disposed below bond finger 216 in FIG. 5.

The pads on semiconductor device 12 and the bond fingers on package board 60 are interconnected as follows: Vdd pads 102 through 104 are connected respectively to bond fingers 112 through 114 by respective wires 122 through 124. Vss pads 105 through 107 are connected respectively to bond fingers 115 through 117 by respective wires 125 through 127. Vdd pad 201 is connected to bond finger 211 by wire 221. Vss pad 206 is connected to bond finger 216 by wire 226. Address signal pads 202 through 205 are connected respectively to bond fingers 212 through 215 by respective wires 222 through 225.

Since the Vss pads or Vdd pads as auxiliary pads are disposed between the address signal pads in the Y-axis directions, the signal wires as wires connected to the signal pads and the Vdd wires as wires to which Vdd is applied or the Vss wires as wires to which Vss is applied are alternately arranged in the Y-axis directions. Therefore, the SG ratio is improved to 1:1.

With the semiconductor package according to the present exemplary embodiment, since the SG ratio is improved and the Vdd wires or the Vss wires are disposed next to the signal wires, the loop inductance between S and G wires can be reduced by mutual inductance for faster signal transmission.

The cross-sectional structures of central portions of the semiconductor device according to the present exemplary embodiment will be described below.

Figure 6A:
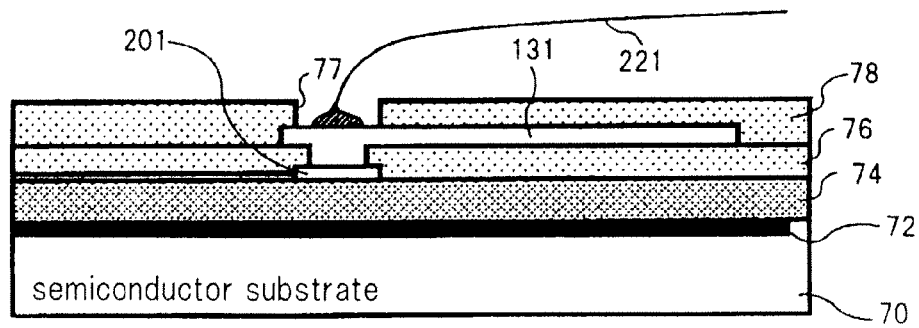
FIGS. 6A and 6B are cross-sectional views showing structural examples of a semiconductor device shown in FIG. 5.

FIGS. 6A through 7B are cross-sectional views showing structural examples of the semiconductor device shown in FIG. 5. FIG. 6A is a cross-sectional view showing a structural example of Vdd pad 201, and FIG. 6B is a cross-sectional view showing another structural example of Vdd pad 201.

As shown in FIG. 6A, semiconductor device 12 includes circuit forming region 72 in which semiconductor elements and interconnects are disposed in the vicinity of the surface of semiconductor substrate 70. Insulating film 74 is disposed on semiconductor substrate 70. Vdd pad 201 is disposed on an electrically conductive layer on insulating film 74. A multilayer interconnect is disposed between circuit forming region 72 and the electrically conductive layer on which Vdd pad 201 is disposed. For the sake of brevity, the multilayer interconnect is omitted from the illustrations in 6A through 7B, and a detailed description about the multilayer interconnect is omitted.

As shown in FIG. 6A, polyimide film 76 is disposed on insulating film 74 as a protective film covering the electrically conductive layer on which Vdd pad 201 is disposed. Polyimide film 76 has an opening defined therein through which the upper surface of Vdd pad 201 is partly exposed for wire bonding between Vdd pad 201 and bond finger 211 on package board 60.

RDL interconnect 131 and polyimide film 78 are formed on polyimide film 76 according the RDL technology. RDL interconnect 131 is formed above the electrically conductive layer on which Vdd pad 201 is disposed. Polyimide film 78 has opening 77 defined therein through which RDL interconnect 131 is partly exposed. Opening 77 serves the same purpose as the opening defined in polyimide film 76, and wire 221 is connected to RDL interconnect 131 through opening 77. Wire 221 is connected to Vdd pad 201 by RDL interconnect 131.

Figure 6B:
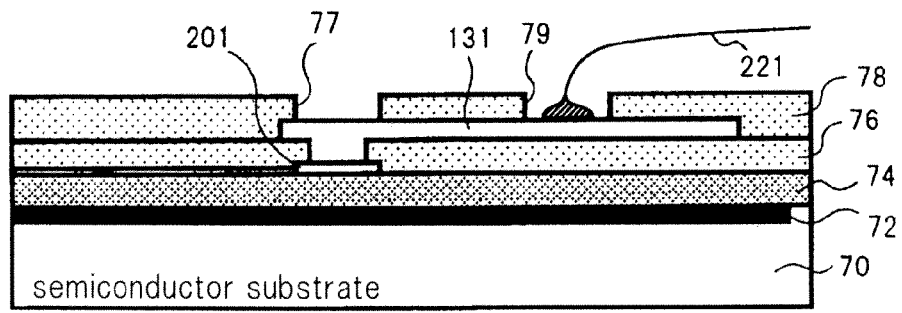

Vdd pad 201 and wire 221 may be connected to each other by a structure other than the structure shown in FIG. 6A. As shown in FIG. 6B, a Vdd pad may be added to the position of pad array 421.

According to the structural example shown in FIG. 6B, polyimide film 78 has opening 79 defined therein other than opening 77. Wire 221 is connected to RDL interconnect 131 through opening 79. Wire 221 is connected to Vdd pad 201 by RDL interconnect 131. The structure shown in FIG. 6B may be applied to Vss pad 206. Since the Vdd pad in opening 79 is closer to bond finger 211 than Vdd pad 201, the structure shown in FIG. 6B may be made shorter than the structure shown in FIG. 6A.

Figure 7A:
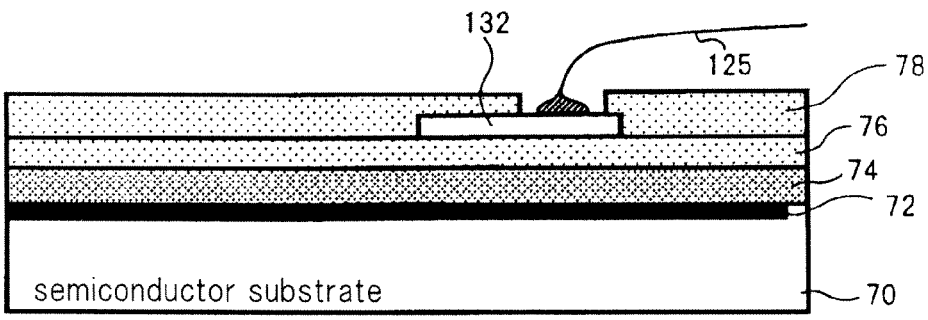
FIGS. 7A and 7B are cross-sectional views showing structural examples of the semiconductor device shown in FIG. 5.
Figure 7B:
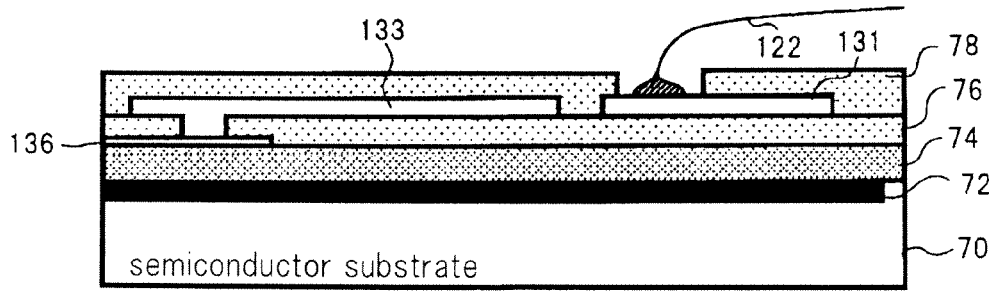

The cross-sectional structures of other RDL interconnects will be described below with reference to FIGS. 7A and 7B. FIG. 7A is a cross-sectional view showing a structural example of Vss pad 105 which is one of the auxiliary pads, and FIG. 7B is a cross-sectional view showing a structural example of portion X1 in FIG. 5.

As shown in FIG. 7A, RDL interconnect 132 is disposed on polyimide film 76. RDL interconnect 132 is covered with polyimide film 78 having an opening defined therein which corresponds to Vss pad 105. Wire 125 is connected to Vss pad 105. The structure shown in FIG. 7A may be applied to not only Vss pad 105, but also Vss pads 106, 107, and Vdd pads 102 through 104.

The structural example of portion X1 in FIG. 5 will be described below. As shown in FIG. 7B, RDL interconnect 133 is disposed on polyimide film 76, and covered with polyimide film 78. FIG. 7B also shows an opening corresponding to Vss pad 102, wire 122, and RDL interconnect 131. RDL interconnect 133 is connected to Vss interconnect 136 through an opening defined in polyimide film 76. Portion X1 of Vss interconnect 136 may be formed such that the area of its planar pattern is equal to or greater than the area of Vdd pad 201 to increase the area of the opening in polyimide film 76, thereby reducing the contact resistance of RDL interconnect 133 and Vss interconnect 136.

By using the RDL technology as described above, it is possible to form RDL interconnects and auxiliary pads above the electrically conductive layer on which Vdd pad 201 is disposed, even over circuit forming region 72 and a region in which a multilayer interconnect, not shown, is formed.

The semiconductor device according to the present exemplary embodiment makes it possible to improve the SG ratio of wires to a DRAM chip by using RDL interconnects. As a result, the loop inductance between S and G wires is reduced for faster signal transmission, as described above.

2nd Exemplary Embodiment

A semiconductor package according to the second exemplary embodiment is of a structure wherein the mutual inductance between signal wires and Vdd wires is stronger than with the semiconductor package according to the first exemplary embodiment.

Figure 8:
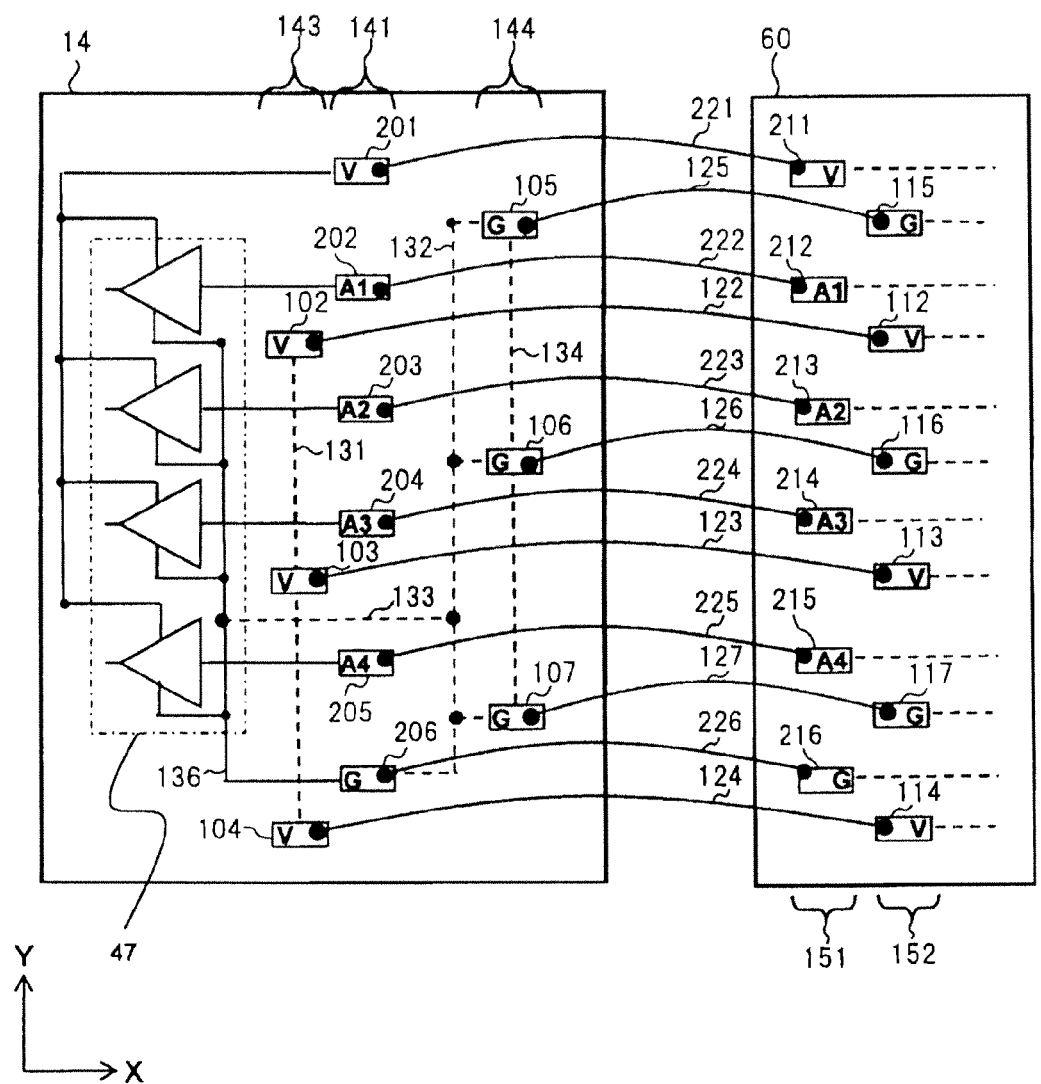
FIG. 8 is a plan view illustrative of a structural example of a central portion of a semiconductor package according to a second exemplary embodiment of the present invention.

The structure of the semiconductor package according to the second exemplary embodiment will be described below. FIG. 8 is a plan view illustrative of a structural example of a central portion of the semiconductor package according to the second exemplary embodiment. As with FIG. 5, it is assumed that horizontal directions in FIG. 8 are referred to as X-axis directions and vertical directions as Y-axis directions. Semiconductor device 14 shown in FIG. 8 includes RDL interconnects indicated by the broken lines.

Figure 1:
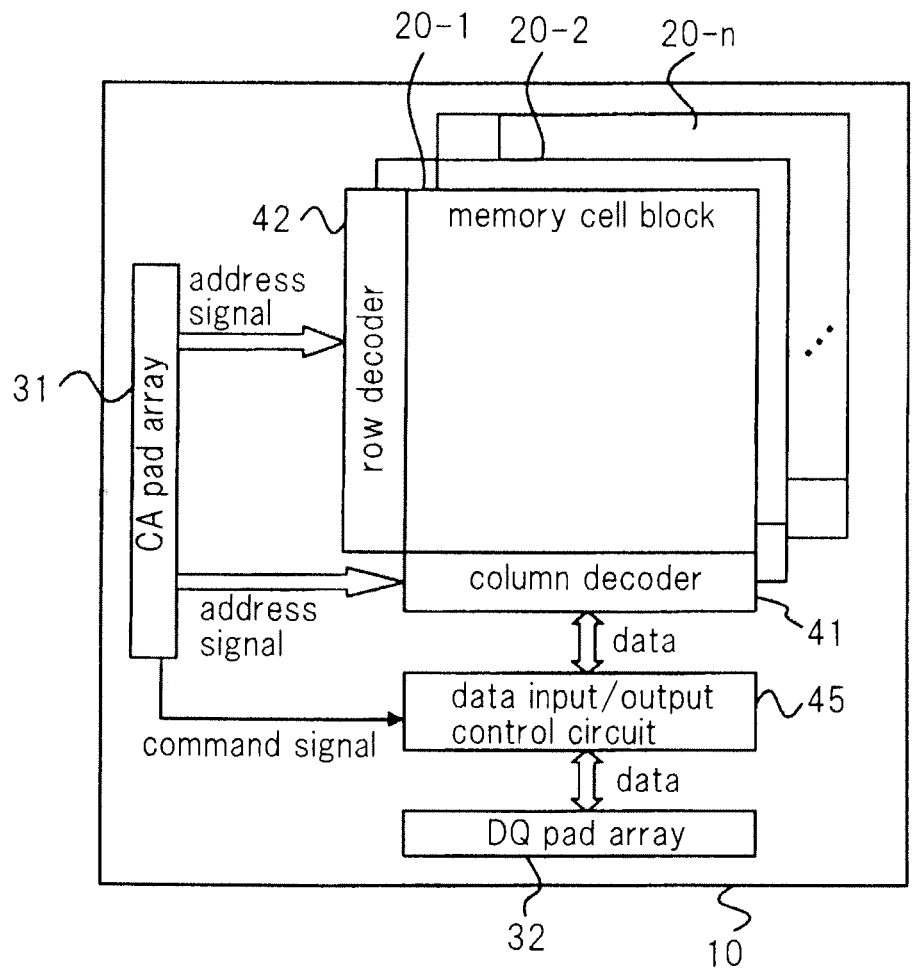
FIG. 1 is a block diagram showing a structural example of a semiconductor device according to the related art.
Figure 2:
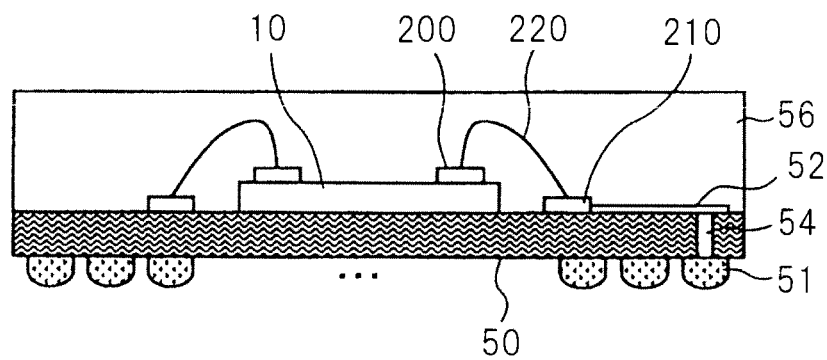
FIG. 2 is a cross-sectional view showing a structural example of a semiconductor package including the semiconductor device shown in FIG. 1.

Semiconductor device 14 shown in FIG. 8 has the structure shown in FIG. 1. The structural details shown in FIG. 1 will not be described below, and those details of semiconductor device 14 which are different from those shown in FIG. 3 or the first exemplary embodiment will be described below.

According to the second exemplary embodiment, the auxiliary pads of pad array 142 on semiconductor device 12 shown in FIG. 5 are divided into pad array 143 and pad array 144 on semiconductor device 14. Pad array 141, 142, 143 extend parallel to the Y-axis directions, and are disposed in different directions along the X-axis directions. Pad array 144 is positioned more closely to an outer peripheral edge of semiconductor device 14 than pad array 143.

In pad array 143, Vdd pads 102 through 104 are successively arranged at a spaced interval between adjacent ones thereof along the Y-axis directions. Vdd pads 102 through 104 are connected to each other by RDL interconnect 131. In pad array 144, Vss pads 105 through 107 are successively arranged at a spaced interval between adjacent ones thereof along the Y-axis directions. Vss pads 105 through 107 are connected to each other by RDL interconnect 132. FIG. 8 shows that Vss pads 105 through 107 are also connected to each other by RDL interconnect 134. However, RDL interconnect 134 may be dispensed with.

RDL interconnect 132 is connected to Vss interconnect 136 by RDL interconnect 133. The connection between RDL interconnect 133 and Vss interconnect 136 is of the same structure as the connection described with reference to FIG. 7B, and will not be described in detail below. In FIG. 8, RDL interconnect 133 and RDL interconnect 131 are shown as crossing each other. They can be electrically insulated from each other by applying the multilayer interconnect technology to RDL interconnects. For example, in the structure shown in FIGS. 6A and 6B, RDL interconnect 133 may be formed on polyimide film 78 which covers RDL interconnect 131, and may be covered with another polyimide film.

The layout of the bond fingers of each of bond finger arrays 151, 152 on package board 60 is the same as the layout according to the first exemplary embodiment, and will not be described in detail below.

The positions in the Y-axis directions of the auxiliary pads of semiconductor device 14 will be compared with the positions of the pads of pad array 141 below. Vdd pad 102 is disposed between Vdd pad 202 and address signal pad 203. Vss pad 106 is disposed between address signal pad 203 and address signal pad 204. Vdd pad 103 is disposed between address signal pad 204 and address signal pad 205. Vss pad 107 is disposed between address signal pad 205 and Vss pad 206. Vdd pad 104 is disposed below Vss pad 206 in FIG. 8.

With respect to the connections between the pads and the bond fingers, the pads and the bond fingers are connected by wires depending on the types of the pads and the types of the bond fingers, in the same manner as with the first exemplary embodiment. According to the present exemplary embodiment, since pad array 143 is positioned more remotely from bond finger arrays 151, 152 than pad array 141, wires 122 through 124 are longer than those according to the first exemplary embodiment. Therefore, wires 122, 123 extend along wires 222 through 225 over a greater distance, making it more effective to increase the reduction in the loop inductance.

According to the present exemplary embodiment, since the Vss pads or Vdd pads as auxiliary pads are disposed between the address signal pads in the Y-axis directions, the signal wires and the Vdd wires or the Vss wires are alternately arranged in the Y-axis directions. Therefore, the SG ratio is improved to 1:1.

According to the present exemplary embodiment, furthermore, as the mutual inductance between the signal wires and the Vdd wires is more effective, the loop inductance between S and G wires is reduced.

3rd Exemplary Embodiment

A semiconductor package according to the third exemplary embodiment is of a structure wherein there are greater intervals at which address signal pads are spaced than the first exemplary embodiment.

Figure 9:
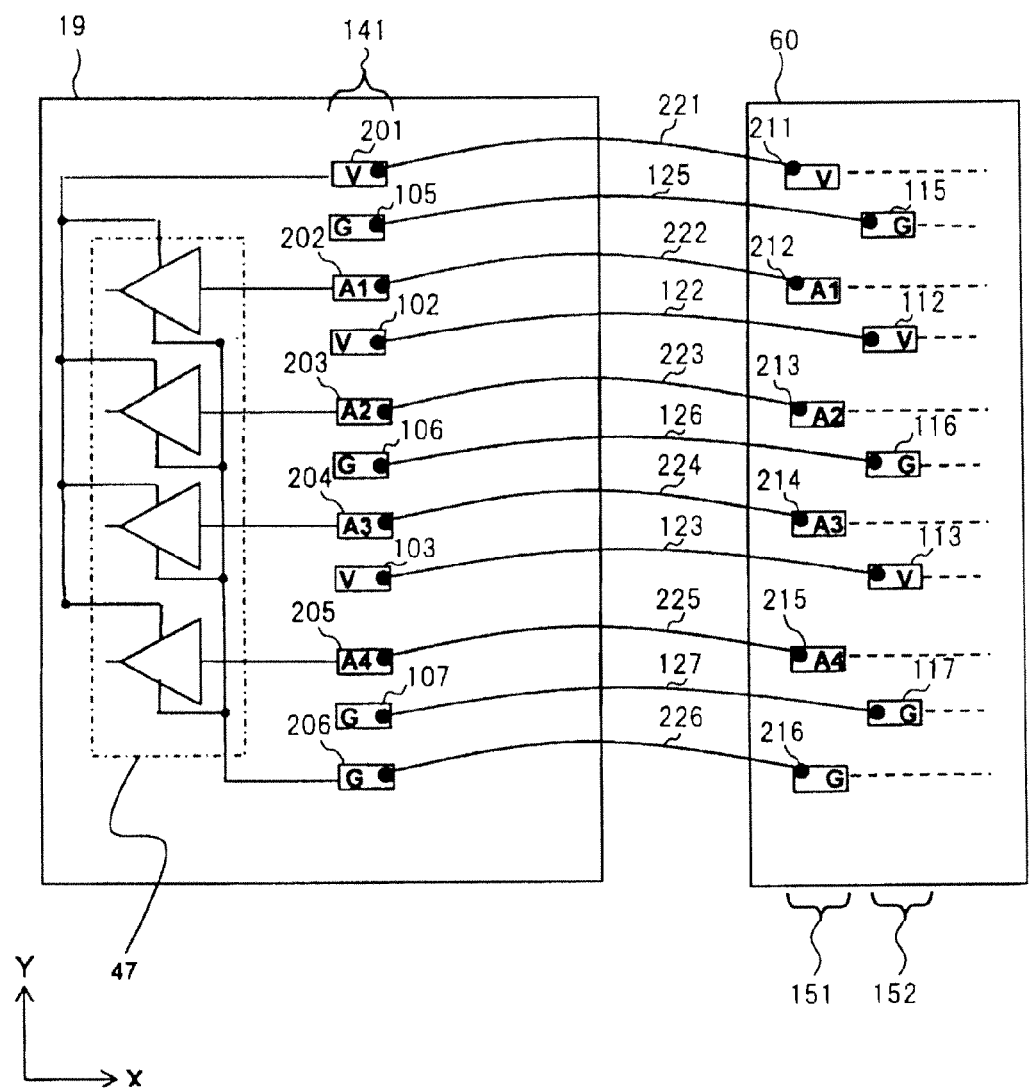
FIG. 9 is a plan view illustrative of a structural example of a central portion of a semiconductor package according to a third exemplary embodiment of the present invention.

The structure of the semiconductor package according to the third exemplary embodiment will be described below. FIG. 9 is a plan view illustrative of a structural example of a central portion of the semiconductor package according to the third exemplary embodiment. As with FIG. 5, it is assumed that horizontal directions in FIG. 9 are referred to as X-axis directions and vertical directions as Y-axis directions.

Semiconductor device 19 shown in FIG. 9 has the structure shown in FIG. 1. The structural details shown in FIG. 1 will not be described below, and those details of semiconductor device 19 which are different from those shown in FIG. 3 or the first exemplary embodiment or the second exemplary embodiment will be described below.

Pad array 141 includes, in addition to address signal pads 202 through 205, Vdd pad 201, and Vdd pad 206, Vdd pads 102, 103 and Vss pads 105 through 107 as auxiliary pads. Each of address signal pads 202 through 205 is disposed between a Vdd pad and a Vss pad as auxiliary pads. Vdd pads 102, 103 are connected to bond fingers 112, 113 by wires 122, 123. Vss pads 105 through 107 are connected to bond fingers 115 through 117 by wires 125 through 127.

With the above arrangement, any one of wires 222 through 225 by which address signal pads 202 through 205 are connected respectively to bond fingers 212 through 215 is disposed between a wire connected to a power supply voltage bond finger and a wire connected to a ground potential bond finger.

The present exemplary embodiment is effective in the case where, with respect to the layout of the auxiliary pads, there is sufficient room between the signal pads, but there is no sufficient room between the signal pads and the outer peripheral edge of semiconductor device 19.

In the present exemplary embodiment, the auxiliary pads are not connected by RDL interconnects. However, the auxiliary pads may be connected by RDL interconnects which are provided in the same manner as the arrangement shown in FIG. 5.

In the present exemplary embodiment, a single pad array is disposed in the vicinity of the outer peripheral edge of semiconductor device 19 near package board 60. However, if there is sufficient room between the bond fingers on package board 60, then a single bond finger array may be disposed on package board 60, as with pad array 141 shown in FIG. 9. In such a case, an address signal bond finger is disposed between a power supply voltage bond finger and a ground potential bond finger.

EXAMPLE 1

The present example is concerned with a semiconductor package having a PoP structure in which two semiconductor devices are stacked on a package board.

Figure 10:
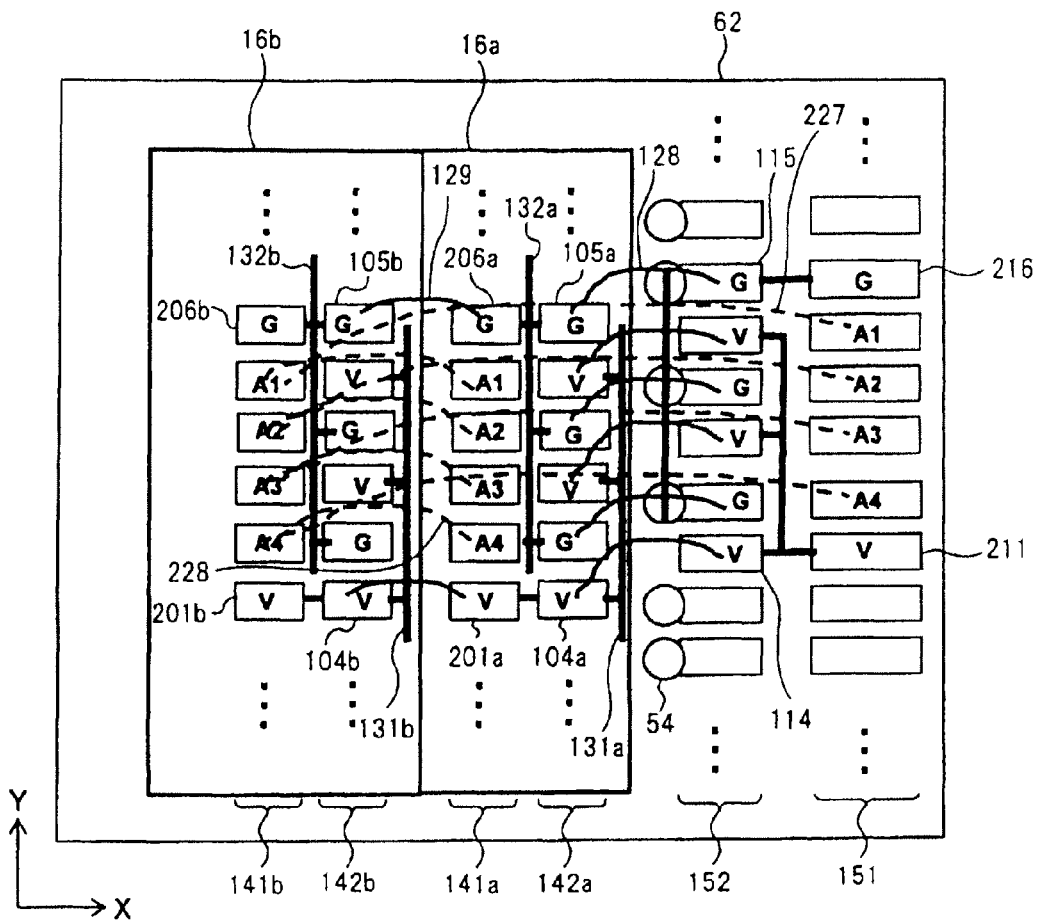
FIG. 10 is a plan view of the semiconductor package according to Example 1.
Figure 11:
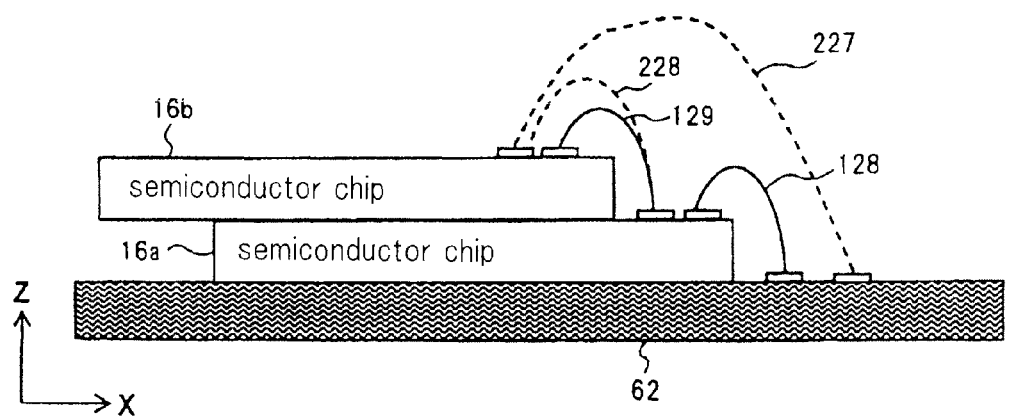
FIG. 11 is a side sectional view of the semiconductor package according to Example 1.

The structure of the semiconductor package according to the present example will be described below. FIG. 10 is a plan view of the semiconductor package according to the present example, and FIG. 11 is a side sectional view of the semiconductor package according to the present example. In FIGS. 10 and 11, a resin body which covers semiconductor chips is omitted from illustration. It is assumed that horizontal directions in FIG. 10 are referred to as X-axis directions, vertical directions as Y-axis directions, and directions perpendicular to the principal surface of package board 62 as Z-axis directions.

As shown in FIG. 11, semiconductor chip 16a and semiconductor chip 16b are successively stacked on package board 62. Each of semiconductor chips 16a, 16b is a DRAM chip. As shown in FIGS. 10 and 11, semiconductor chip 16b is displaced in an X-axis direction from a position in full alignment with semiconductor chip 16a, in order to expose a pad area of semiconductor chip 16a.

According to the present example, each of semiconductor chips 16a, 16b is of a structure in which the pads of pad array 141 and the pads of pad array 142 on semiconductor device 12 according to the first exemplary embodiment are aligned with each other with respect to their positions in the Y-axis directions. For example, Vss pad 206a of pad array 141a and Vss pad 105a of pad array 142a on semiconductor chip 16a are aligned with each other with respect to their positions in the Y-axis directions. On semiconductor chip 16a shown in FIG. 10, the positions in the Y-axis directions of Vdd pad 201a and Vss pad 206a are opposite to those on semiconductor device 12 shown in FIG. 5. However, any one of the positions shown in FIGS. 5 and 10 may be employed. This also holds true for semiconductor chip 16b.

On semiconductor chip 16a, a plurality of Vss pads are connected to each other by RDL interconnection 132a, and a plurality of Vdd pads are connected to each other by RDL interconnect 131a. These connections are also employed on semiconductor chip 16b.

Package board 62 is similar to package board 60 according to the first exemplary embodiment except that bond finger arrays 151, 152 are positionally switched around in the X-axis directions. On package board 62, the positions in the Y-axis directions of bond fingers 211, 216 of bond finger array 151 are aligned with those of Vdd pads 201a, 201b and Vss pads 206a, 206b on semiconductor chips 16a, 16b.

On package board 62, a plurality of ground potential bond fingers are connected to each other by interconnects, and a plurality of power supply voltage bond fingers are connected to each other by interconnects. Some of the ground potential bond fingers are connected to via plugs 54.

Connections between the pads on semiconductor chips 16a, 16b and the bond fingers on package board 62 will be described below.

Address signal bond fingers A1 through A4 of bond finger array 151 are connected respectively to address signal pads A1 through A4 on semiconductor chip 16b by wires 227. Address signal pads A1 through A4 on semiconductor chip 16b are connected respectively to address signal pads A1 through A4 on semiconductor chip 16a by wires 228. With these connections, address signals sent from package board 62 are supplied through wires 227 to semiconductor chip 16b, and then supplied through wires 227, the address signal pad on semiconductor chip 16b, and wires 228 to semiconductor chip 16a.

Ground potential bond fingers G and power supply voltage bond fingers V of bond finger array 152 are connected respectively to the Vss pads and the Vdd pads of pad array 142a on semiconductor chip 16a by wires 128. Vss pad 206a on semiconductor chip 16a and Vss pad 105b on semiconductor chip 16b are connected to each other by wire 129. Vss pad 201a on semiconductor chip 16a and Vss pad 104b on semiconductor chip 16b are connected to each other by wire 129.

With the above connections, a power supply voltage supplied from package board 62 is applied through wires 128 to semiconductor chip 16a, and then is applied through wires 128, the Vdd pads and RDL interconnect 131a on semiconductor chip 16a, and wires 129 to semiconductor chip 16b. A ground potential supplied from package board 62 is applied through wires 128 to semiconductor chip 16a, and then is applied through wires 128, the Vss pads and RDL interconnect 132a on semiconductor chip 16a, and wires 129 to semiconductor chip 16b.

As shown in FIG. 11, since wires 227 are connected to upper semiconductor chip 16b, rather than lower semiconductor chip 16a, wires 227 extend along a large arc. Furthermore, since bond finger array 152 is positioned more closely to the outer peripheral edge of semiconductor chip 16a than bond finger array 151, the distance between bond fingers of bond finger array 152 and the auxiliary pads of pad array 142a on semiconductor chip 16a is small which causes the arc of wires 128 to be smaller than the arc of wires 227.

The arcs of wires 227, 128 will be compared with each other as shown in FIG. 11. Portions of the arcs which extend from package board 62 to the highest points of the arcs are inclined to the X-axis by similar angles, and hence these two arcs are similar in shape to each other. Accordingly, the portions of wires 227, 218 which rise from package board 62 extend parallel to each other while being electrically insulated from each other. The signal wires extend along the Vdd wires or the Vss wires in the Z-axis directions. In the present example, although the distance between the signal wires and the Vdd wires and the distance between the signal wires and the Vss wires are not completely the same as each other, at least the SG ratio is improved to a level better than 4:1.

According to the present example, the Vdd wires and the Vss wires are positioned as closely to the signal wires as possible to reduce the loop inductance between S and G wires on the semiconductor package on which two semiconductor chips are stacked.

Package board 60 shown in FIG. 5 may also have the positions in the X-axis directions of bond finger arrays 151, 152 switched around, as with those on package board 62. In such a case, even though the pads of pad arrays 141, 142 on semiconductor device 12 are aligned with each other with respect to their positions in the Y-axis directions, as with those on semiconductor chip 16a, the signal wires and the Vdd wires or the Vss wires are held out of contact with each other, and the signal wires are positioned closely to the Vdd wires or the Vss wires in the Z-axis directions. Therefore, the present example offers the same advantages as the first exemplary embodiment.

EXAMPLE 2

The present example is concerned with another semiconductor package having a PoP structure in which two semiconductor devices are stacked on a package board.

The structure of the semiconductor package according to the present example will be described below. The structural details which are identical to those of Example 1 will not be describe below, and those details which are different from those of Example 1 will be described below.

Figure 12:
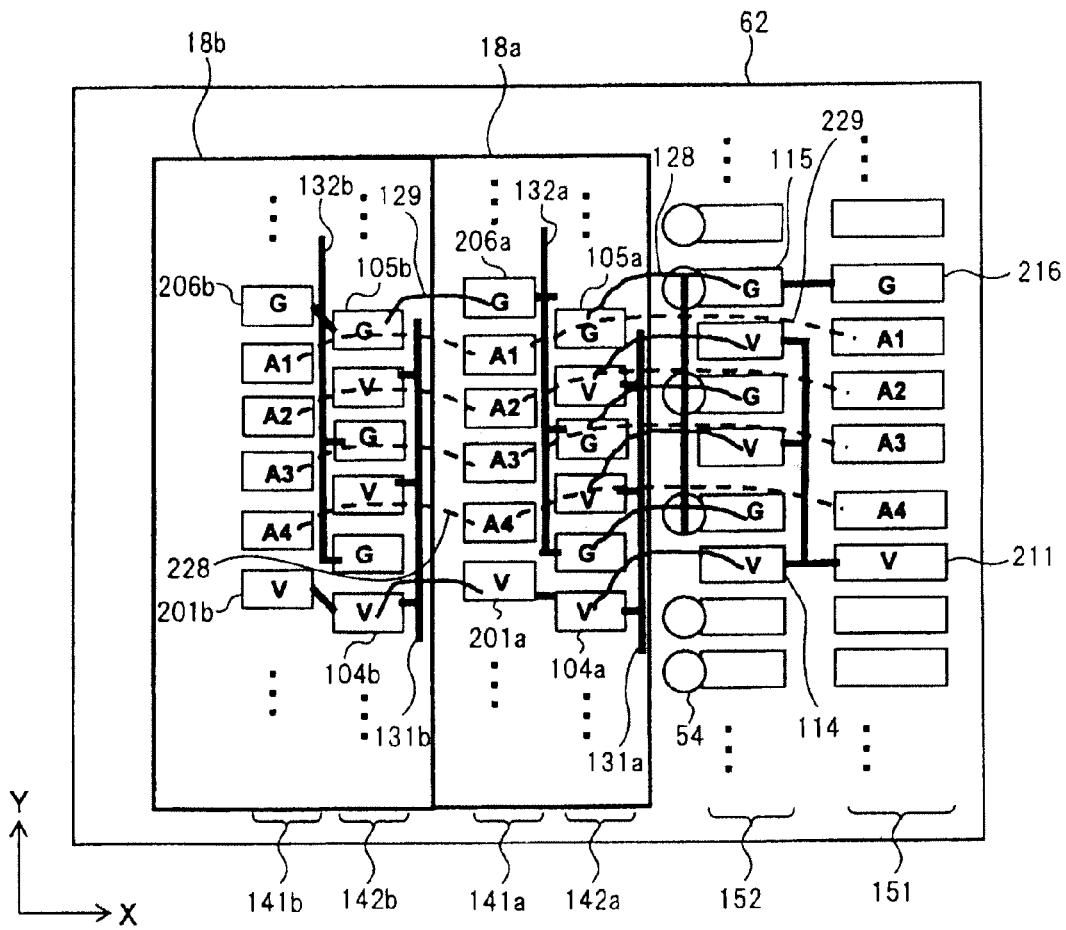
FIG. 12 is a plan view of the semiconductor package according to Example 2.
Figure 13:
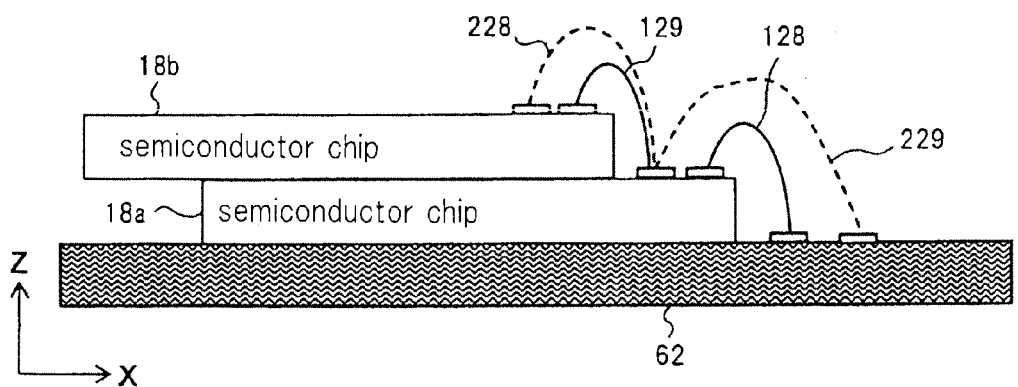
FIG. 13 is a side sectional view of the semiconductor package according to Example 2.

FIG. 12 is a plan view of the semiconductor package according to the present example. FIG. 13 is a side sectional view of the semiconductor package according to the present example. In FIGS. 12 and 13, a resin body which covers semiconductor chips is omitted from illustration. It is assumed, as with FIG. 10, that horizontal directions in FIG. 12 are referred to as X-axis directions, vertical directions as Y-axis directions, and directions perpendicular to the principal surface of package board 62 as Z-axis directions.

As shown in FIG. 13, semiconductor chip 18a and semiconductor chip 18b are successively stacked on package board 62. Each of semiconductor chips 18a, 18b is a DRAM chip. As with Example 1, semiconductor chip 18b is displaced in an X-axis direction from a position in full alignment with semiconductor chip 18a, in order to expose a pad area of semiconductor chip 18a.

According to the present example, semiconductor chip 18a is of a structure in which the pads of pad array 141a and the pads of pad array 142a on semiconductor chip 16a according to Example 1 have shifted with respect to their positions in the Y-axis directions. For example, Vss pad 206a of pad array 141a and Vss pad 105a of pad array 142a on semiconductor chip 16a have their centers of gravity shifted out of alignment with respect to their positions in the Y-axis directions. The center of gravity of a pad having a quadrangular shape refers to a point of intersection between two diagonal lines.

In the Y-axis directions, the center of gravity of each of address signal pads A1 through A4 of pad array 141a is positioned between the centers of gravity of a Vss pad and a Vdd pad which are adjacent each other. In the example shown in FIG. 12, the center of gravity of each of address signal pads A1 through A4 is positioned intermediate between the centers of gravity of a Vss pad and a Vdd pad which are adjacent each other.

Semiconductor chip 18b is of the same structure as semiconductor chip 18a described above, and will not be described below.

Connections between the pads on semiconductor chips 18a, 18b and the bond fingers on package board 62 will be described below.

In Example 1, the bond fingers of bond finger array 151 are connected to the pads of pad array 141b on upper semiconductor ship 16b. In the present example, however, the bond fingers of bond finger array 151 are connected to the pads of pad array 141a on lower semiconductor ship 18a.

Address signal bond fingers A1 through A4 of bond finger array 151 are connected respectively to address signal pads A1 through A4 on semiconductor chip 18a by wires 229. The other connections are the same as those of Example 1.

With these connections, address signals sent from package board 62 are supplied through wires 229 to semiconductor chip 18a, and then supplied through wires 229, the address signal pad on semiconductor chip 18a, and wires 228 to semiconductor chip 18b. A power supply voltage and a ground potential supplied from package board 62 to each of semiconductor chips 18a, 18b follow the same routes as those of Example 1.

As shown in FIG. 13, since wires 229 are connected to lower semiconductor chip 18a, wires 229 extend along an arc which is smaller than the arc of wires 227 shown in FIG. 11. As a result, the distance between wires 229 and wires 128 is smaller than the distance between wires 227 and wires 128, thereby making it more effective to reduce the loop inductance caused by the Vdd wires and the Vss wires with respect to the signal wires.

As wires 229 are positioned more closely to wires 128 than wires 227 in the Z-axis directions, they may possibly be brought into contact with each other. According to the present example, however, since the center of gravity of each of the signal pads is positioned between the centers of gravity of two adjacent auxiliary pads in the Y-axis directions, wires 229 and wires 128 are positionally displaced away from each other in the Y-axis directions. As a result, wires 229 and wires 128 are prevented from coming into contact with each other. Furthermore, inasmuch as wires 128 connected to the Vdd pads and wires 128 connected to the Vss pads are disposed in sandwiching relation to wires 229, the Vdd wires and the Vss wires extend along the signal wires in the Y-axis directions.

According to the present example, the signal pads and the auxiliary pads of the semiconductor package having the two stacked semiconductor chips are arranged in a staggering pattern to position the signal wires parallel to and between the Vdd wires and the Vss wires. As a consequence, the Vdd wires and the Vss wires are positioned more closely to the signal wires to reduce the loop inductance between S and G wires, than in the case of Example 1.

The layout of pads according to the present example may be applied to one from among Example 1, the first and second exemplary embodiments.

According to the present disclosure, since the bonding wires to which the power supply voltage is applied and the bonding wires to which the ground potential is applied are disposed closely to the bonding wires for transmitting signals, the loop inductance between S and G wires can be reduced for faster signal transmission. In each of these exemplary embodiments and examples, the power supply voltage corresponds to a first power supply voltage, and the ground potential corresponds to a second power supply voltage.

It is apparent that the present invention is not limited to the above embodiments, but may be modified and changed without departing from the scope and spirit of the invention.

What is claimed is:

1. A semiconductor package comprising:
   a semiconductor device including a plurality of signal pads and a plurality of auxiliary pads which are alternatively arranged in a predetermined direction; and
   a package board including a plurality of signal bond fingers arranged in said predetermined direction for supplying signals to said signal pads, a plurality of first power supply voltage bond fingers arranged in said predetermined direction for supplying a first power supply voltage to said auxiliary pads, and a plurality of second power supply voltage bond fingers arranged in said predetermined direction for supplying a second power supply voltage to said auxiliary pads, said semiconductor device being mounted on said package board;
   wherein said signal pads are connected respectively to said signal bond fingers by first wires;
   said first power supply voltage bond fingers and said second power supply voltage bond fingers are connected respectively to said auxiliary pads by second wires; and
   said first wires are disposed between those of said second wires which are connected to said first power supply voltage bond fingers and those of said second wires which are connected to said second power supply voltage bond fingers.

2. The semiconductor package according to claim 1, wherein said signal pads are arrayed in a first pad array parallel to said predetermined direction; and
   said auxiliary pads are arrayed in said first pad array.

3. The semiconductor package according to claim 1, wherein said signal pads are arrayed in a first pad array extending parallel to said predetermined direction; and
   said auxiliary pads are arrayed in a second pad array which extends parallel to and is different from said first pad array.

4. The semiconductor package according to claim 3, wherein said signal bond fingers are arrayed in a first bond finger array which extends parallel to said first pad array;
   said first power supply voltage bond fingers and said second power supply voltage bond fingers are arrayed in a second bond finger array which extends parallel to and is different from said first bond finger array;
   said second pad array is disposed more closely to an outer peripheral edge of said semiconductor device than said first pad array; and
   said first bond finger array is disposed more closely to the outer peripheral edge of said semiconductor device than said second bond finger array.

5. The semiconductor package according to claim 1, wherein said signal pads are arrayed in a first pad array parallel to said predetermined direction;
   said auxiliary pads include first power supply voltage auxiliary pads which are connected to said first power supply voltage bond fingers by said second wires, said first power supply voltage auxiliary pads being arrayed in a second pad array which extends parallel to and is different from said first pad array; and
   said auxiliary pads include second power supply voltage auxiliary pads which are connected to said second power supply voltage bond fingers by said second wires, said second power supply voltage auxiliary pads being arrayed in a third pad array which is different from said first pad array and said second pad array.

6. The semiconductor package according to claim 1, wherein each of said first power supply voltage bond fingers and said second power supply voltage bond fingers is disposed between adjacent two of said signal bond fingers.

7. The semiconductor package according to claim 1, wherein said auxiliary pads are disposed on a first electrically conductive layer on which said signal pads are disposed, with an insulating film interposed between said auxiliary pads and said first electrically conductive layer.

8. The semiconductor package according to claim 5, wherein said auxiliary pads are disposed on a second electrically conductive layer which is disposed on a first electrically conductive layer on which said signal pads are disposed, with an insulating film interposed between said first electrically conductive layer and said second electrically conductive layer; and
   said first power supply voltage auxiliary pads are interconnected by a first interconnect disposed on said second electrically conductive layer, and said second power supply voltage auxiliary pads are interconnected by a second interconnect disposed on said second electrically conductive layer.

9. The semiconductor package according to claim 1, further comprising a plurality of receiver circuits that forms above the semiconductor device, each of the plurality of receiver circuits receives a corresponding one of signals via the plurality of signal pads as an input signal and the first and second power supply voltages as an operating voltage.

10. The semiconductor package according to claim 1, wherein said semiconductor device includes a plurality of memory elements; and
    said signal pads comprise pads which are supplied with an address signal for specifying either one of said memory elements or a command signal for instructing said memory elements to write or read data, from said signal bond fingers.

11. A semiconductor package comprising:
    a first semiconductor device including a first pad array of a plurality of signal pads arranged in a predetermined direction and a second pad array of a plurality of auxiliary pads arranged parallel to said first pad array;
    a second semiconductor device mounted on said first semiconductor device and including a third pad array of a plurality of signal pads arranged parallel to said first pad array and a fourth pad array of a plurality of auxiliary pads arranged parallel to said third pad array; and
    a package board with said first semiconductor device and said second semiconductor device being successively mounted thereon, said package board including a first bond finger array of a plurality of signal bond fingers for supplying signals to said signal pads, said signal bond fingers being arranged parallel to said first pad array, and a second bond finger array of power supply voltage bond fingers for being supplied with a power supply voltage and ground potential bond fingers for being supplied with a ground potential, said power supply voltage bond fingers and said ground potential bond fingers being alternately arranged parallel to said first bond finger array, said second bond finger array being different from said first bond finger array;

wherein said second pad array is disposed more closely to an outer peripheral edge of said first semiconductor device than said first pad array, and said second bond finger array is disposed more closely to the outer peripheral edge of said first semiconductor device than said first bond finger array;

said signal bond fingers are connected respectively to the signal pads of said first pad array or said third pad array by first wires;

said signal pads of said first pad array are connected respectively to said signal pads of said third pad array by second wires; and said power supply voltage bond fingers and said ground potential bond fingers are connected respectively to the auxiliary pads of said second pad array by third wires.

12. The semiconductor package according to claim 10, wherein said signal pads have respective centers of gravity each positioned between the centers of gravity of adjacent two of said auxiliary pads in said predetermined direction.

\* \* \* \* \*